(12) United States Patent
Suto et al.

(10) Patent No.: US 9,688,822 B2
(45) Date of Patent: Jun. 27, 2017

(54) ORGANOPOLYSILOXANE, CURABLE SILICONE COMPOSITION, CURED PRODUCT THEREOF, AND OPTICAL SEMICONDUCTOR

(71) Applicant: Dow Corning Toray Co., Ltd., Tokyo (JP)

(72) Inventors: Michitaka Suto, Ichihara (JP); Takashi Sagawa, Ichihara (JP); Kasumi Takeuchi, Ichihara (JP); Tomohiro Iimura, Ichihara (JP); Kazuhiro Nishijima, Ichihara (JP); Yoshitsugu Morita, Ichihara (JP)

(73) Assignee: DOW CORNING TORAY CO., LTD., Tokyo (JP)

( * ) Notice: Subject to any disclaimer, the term of this patent is extended or adjusted under 35 U.S.C. 154(b) by 0 days.

(21) Appl. No.: 14/438,080

(22) PCT Filed: Oct. 23, 2013

(86) PCT No.: PCT/JP2013/079332
§ 371 (c)(1),
(2) Date: Apr. 23, 2015

(87) PCT Pub. No.: WO2014/065432
PCT Pub. Date: May 1, 2014

(65) Prior Publication Data
US 2015/0329681 A1 Nov. 19, 2015

(30) Foreign Application Priority Data
Oct. 24, 2012 (JP) ................. 2012-235183

(51) Int. Cl.
| | | |
|---|---|---|
| C08G 77/08 | (2006.01) | |
| C08G 77/00 | (2006.01) | |
| C09J 183/04 | (2006.01) | |
| H01L 31/0203 | (2014.01) | |
| C09D 183/04 | (2006.01) | |
| C08L 83/04 | (2006.01) | |
| C08G 77/12 | (2006.01) | |
| C08G 77/20 | (2006.01) | |
| H01L 23/29 | (2006.01) | |
| H01L 33/56 | (2010.01) | |

(52) U.S. Cl.
CPC ........... *C08G 77/80* (2013.01); *C09D 183/04* (2013.01); *C09J 183/04* (2013.01); *H01L 31/0203* (2013.01); *C08G 77/12* (2013.01); *C08G 77/20* (2013.01); *C08L 83/04* (2013.01); *H01L 23/296* (2013.01); *H01L 33/56* (2013.01); *H01L 2224/32245* (2013.01); *H01L 2224/48091* (2013.01); *H01L 2224/48247* (2013.01); *H01L 2224/73265* (2013.01)

(58) Field of Classification Search
CPC ...................................... C08L 83/04
See application file for complete search history.

(56) References Cited

U.S. PATENT DOCUMENTS

| | | | |
|---|---|---|---|
| 7,566,756 B2 | 7/2009 | Kashiwagi | |
| 7,625,986 B2 | 12/2009 | Yoshitake et al. | |
| 8,211,545 B2 | 7/2012 | Asaine | |
| 8,614,282 B2 | 12/2013 | Hamamoto et al. | |
| 2007/0025678 A1* | 2/2007 | Kushibiki | ............... C08L 83/04 385/141 |
| 2007/0244214 A1 | 10/2007 | Yoshitake et al. | |
| 2008/0185601 A1 | 8/2008 | Frisch et al. | |
| 2009/0105395 A1 | 4/2009 | Kamata et al. | |
| 2009/0118440 A1* | 5/2009 | Nakanishi | ............... C08L 83/04 525/478 |
| 2010/0276721 A1 | 11/2010 | Yoshitake et al. | |
| 2011/0177342 A1* | 7/2011 | Itoh | ......................... C08J 7/045 428/414 |
| 2011/0254047 A1* | 10/2011 | Yoshitake | ............... C08L 83/04 257/100 |
| 2012/0056236 A1 | 3/2012 | Hamamoto et al. | |
| 2014/0319575 A1 | 10/2014 | Choi et al. | |

FOREIGN PATENT DOCUMENTS

| | | |
|---|---|---|
| CN | 101284946 A | 10/2008 |
| CN | 101426835 A | 5/2009 |
| JP | 2004-140220 A | 5/2004 |
| JP | 2012-052045 A | 3/2012 |
| TW | 200904900 A | 2/2009 |
| WO | WO 2009/154260 A1 | 12/2009 |
| WO | WO 2014/065433 A1 | 5/2014 |
| WO | WO 2014/069610 A1 | 5/2014 |

OTHER PUBLICATIONS

International Search Report for Application No. PCT/JP2013/079653 dated Dec. 17, 2013, 3 pages.
International Search Report for Application No. PCT/JP2013/079333 dated Apr. 10, 2014, 3 pages.
International Search Report for Application No. PCT/JP2013/079332 dated Apr. 16, 2014, 3 pages.
English language abstract for JP 2012-052045 extracted from espacenet.com database on May 11, 2015, 2 pages.
English language abstract for CN 101284946 extracted from espacenet.com database on Apr. 6, 2016, 1 page.
English language abstract for CN 101426835 extracted from espacenet.com database on May 17, 2016, 2 pages.
English language abstract and machine-assisted English translation for JP 2004-140220 extracted from espacenet.com database on May 17, 2016, 14 pages.
English language abstract for TW 200904900 extracted from espacenet.com database on May 17, 2016, 1 page.

* cited by examiner

*Primary Examiner* — Margaret Moore
(74) *Attorney, Agent, or Firm* — Howard & Howard Attorneys PLLC

(57) ABSTRACT

The present invention relates to a curable silicone composition comprising: (A) an organopolysiloxane represented by a specific average unit formula, (B) an optional straight-chain organopolysiloxane having at least two alkenyl groups and not having any silicon-bonded hydrogen atoms in a molecule, (C) an organopolysiloxane having at least two silicon-bonded hydrogen atoms in a molecule, and (D) a hydrosilylation reaction catalyst. The curable silicone composition has high reactivity and forms a cured product with low gas permeability.

3 Claims, 1 Drawing Sheet

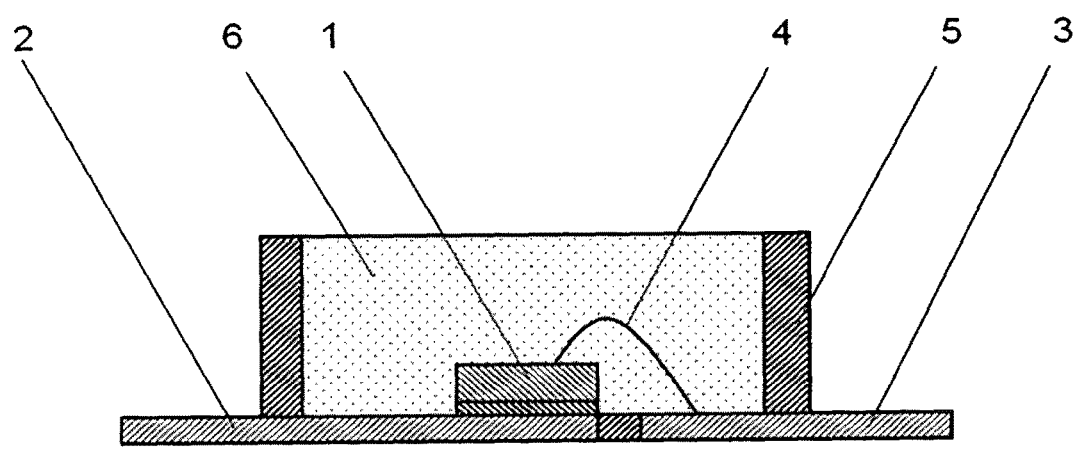

ORGANOPOLYSILOXANE, CURABLE SILICONE COMPOSITION, CURED PRODUCT THEREOF, AND OPTICAL SEMICONDUCTOR

RELATED APPLICATIONS

This application is the National Stage of International Patent Application No. PCT/JP2013/079332, filed on Oct. 23, 2013, which claims priority to and all the advantages of Japanese Patent Application No. 2012-235183, filed on Oct. 24, 2012, the content of which is incorporated herein by reference.

TECHNICAL FIELD

The present invention relates to an organopolysiloxane, a curable silicone composition primarily comprising the organopolysiloxane, a cured product formed by curing the composition, and an optical semiconductor device produced using the composition.

BACKGROUND ART

Curable silicone compositions are used as sealing materials or protective coating materials for optical semiconductor elements in optical semiconductor devices such as light emitting diodes (LEDs). However, since the gas permeability of a cured product of a curable silicone composition is high, problems such as the discoloration of the sealing material due to corrosive gas and the reduction of brightness due to the corrosion of silver plate on the LED substrate occur when used in a high-brightness LED with high optical intensity and a large amount of heat generation.

Therefore, a curable silicone composition comprising a branched-chain organopolysiloxane having methylphenylvinylsiloxane units, an organohydrogenpolysiloxane, and an addition reaction catalyst is proposed in Japanese Unexamined Patent Application Publication No. 2012-052045 as a curable silicone composition which forms a cured product with low gas permeability.

However, such a curable silicone composition yields a slow curing reaction, and when curing is insufficient, tackiness occurs on the surface of the cured product, which is problematic in that dirt or dust adheres to the surface. In addition, there is also the problem that a large amount of time and energy are required to complete the curing reaction of such a curable silicone composition.

An object of the present invention is to provide an organopolysiloxane having high hydrosilylation reactivity and forming a cured product with low gas permeability, and further to provide a curable silicone composition having high reactivity and forming a cured product with low gas permeability. Another object of the present invention is to provide a cured product with low gas permeability, and further to provide an optical semiconductor device with excellent reliability.

DISCLOSURE OF INVENTION

The organopolysiloxane of the present invention is represented by the following average unit formula:

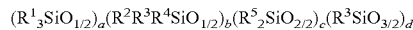

wherein, $R^1$ are the same or different alkyl groups having from 1 to 12 carbons or alkenyl groups having from 2 to 12 carbons; provided that at least one $R^1$ in a molecule is an alkenyl group having from 2 to 12 carbons; $R^2$ is an alkyl group having from 1 to 12 carbons; $R^3$ are the same or different aryl groups having from 6 to 20 carbons or aralkyl groups having from 7 to 20 carbons; $R^4$ is an alkenyl group having from 2 to 12 carbons; $R^5$ are the same or different alkyl groups having from 1 to 12 carbons, alkenyl groups having from 2 to 12 carbons, or phenyl groups; and "a", "b", "c", and "d" are respectively numbers satisfying $0.01 \leq a \leq 0.45$, $0.01 \leq b \leq 0.45$, $0 \leq c \leq 0.7$, $0.1 \leq d < 0.9$, and $a+b+c+d=1$.

The curable silicone composition of the present invention comprises:
(A) an organopolysiloxane represented by the following average unit formula:

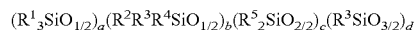

wherein, $R^1$ are the same or different alkyl groups having from 1 to 12 carbons or alkenyl groups having from 2 to 12 carbons; provided that at least one $R^1$ in a molecule is an alkenyl group having from 2 to 12 carbons; $R^2$ is an alkyl group having from 1 to 12 carbons; $R^3$ are the same or different aryl groups having from 6 to 20 carbons or aralkyl groups having from 7 to 20 carbons; $R^4$ is an alkenyl group having from 2 to 12 carbons; $R^5$ are the same or different alkyl groups having from 1 to 12 carbons, alkenyl groups having from 2 to 12 carbons, or phenyl groups; and "a", "b", "c", and "d" are respectively numbers satisfying $0.01 \leq a \leq 0.45$, $0.01 \leq b \leq 0.45$, $0 \leq c \leq 0.7$, $0.1 \leq d < 0.9$, and $a+b+c+d=1$;
(B) a straight-chain organopolysiloxane having at least two alkenyl groups and not having any silicon-bonded hydrogen atoms in a molecule, in 0 to 70 mass % of this composition;
(C) an organopolysiloxane having at least two silicon-bonded hydrogen atoms in a molecule, in an amount that the amount of silicon-bonded hydrogen atoms in this component is from 0.1 to 5 mol per 1 mol of total alkenyl groups in components (A) and (B); and
(D) an effective amount of a hydrosilylation reaction catalyst.

The cured product of the present invention is formed by curing the aforementioned curable silicone composition.

The optical semiconductor device of the present invention is produced by sealing an optical semiconductor element with a cured product of the curable silicone composition described above.

Effects of Invention

The organopolysiloxane of the present invention is characterized by having high hydrosilylation reactivity and forming a cured product with low gas permeability, and the curable silicone composition of the present invention is characterized by having high reactivity and forming a cured product with low gas permeability. Further, the cured product of the present invention is characterized in that the gas permeability is low, and the optical semiconductor device of the present invention is characterized by having excellent reliability.

BRIEF DESCRIPTION OF THE DRAWINGS

FIG. 1 is a cross-sectional view of an LED that is an example of the optical semiconductor device of the present invention.

DETAILED DESCRIPTION OF THE INVENTION

First, the organopolysiloxane of the present invention will be described in detail.

The organopolysiloxane of the present invention is represented by the following average unit formula:

$$(R^1_3SiO_{1/2})_a(R^2R^3R^4SiO_{1/2})_b(R^5_2SiO_{2/2})_c(R^3SiO_{3/2})_d.$$

In the formula, $R^1$ are the same or different alkyl groups having from 1 to 12 carbons or alkenyl groups having from 2 to 12 carbons. Examples of the alkyl groups of $R^1$ include methyl groups, ethyl groups, propyl groups, butyl groups, pentyl groups, hexyl groups, heptyl groups, octyl groups, nonyl groups, decyl groups, undecyl groups, and dodecyl groups. Of these, methyl groups are preferable. Examples of the alkenyl groups of $R^1$ include vinyl groups, allyl groups, butenyl groups, pentenyl groups, hexenyl groups, heptenyl groups, octenyl groups, nonenyl groups, decenyl groups, undecenyl groups, and dodecenyl groups. Of these, vinyl groups are preferable. Here, at least one of $R^1$ in a molecule is an alkenyl group having from 2 to 12 carbons. $R^2$ is an alkyl group having from 1 to 12 carbons, and examples of the alkyl group having from 1 to 12 carbons of $R^2$ include the same alkyl groups as those of $R^1$ described above. Of those, methyl groups are preferable. $R^3$ are the same or different aryl groups having from 6 to 20 carbons or aralkyl groups having from 7 to 20 carbons. Examples of the aryl groups of $R^3$ include phenyl groups, tolyl groups, xylyl groups, naphthyl groups, anthracenyl groups, phenanthryl groups, pyrenyl groups, and groups in which the hydrogen atoms of these aryl groups are substituted with alkyl groups such as methyl groups and ethyl groups, alkoxy groups such as methoxy groups and ethoxy groups, or halogen atoms such as chlorine atoms and bromine atoms. Of these, phenyl groups and naphthyl groups are preferable. Examples of the aralkyl groups of $R^3$ include benzyl groups, phenethyl groups, naphthyl ethyl groups, naphthyl propyl groups, anthracenyl ethyl groups, phenanthryl ethyl groups, pyrenyl ethyl groups, and groups in which the hydrogen atoms of these aralkyl groups are substituted with alkyl groups such as methyl groups and ethyl groups, alkoxy groups such as methoxy groups and ethoxy groups, or halogen atoms such as chlorine atoms and bromine atoms. $R^4$ is an alkenyl group having from 2 to 12 carbons, and examples of the alkenyl group having from 2 to 12 carbons of $R^4$ include the same alkenyl groups as those of $R^1$. Of those, vinyl groups are preferable. $R^5$ are the same or different alkyl groups having from 1 to 12 carbons, alkenyl groups having from 2 to 12 carbons, or phenyl groups. Examples of the alkyl group of $R^5$ include the same alkyl groups described for $R^1$. Examples of the alkenyl group of $R^5$ include the same alkenyl groups described for $R^1$.

Further, in the formula, "a", "b", "c", and "d" are numbers that satisfy the following conditions: $0.01 \leq a \leq 0.45$, $0.01 \leq b \leq 0.45$, $0 \leq c \leq 0.7$, $0.1 \leq d < 0.9$, and $a+b+c+d=1$. Preferably, "a", "b", "c", and "d" are numbers that satisfy the following conditions: $0.05 \leq a \leq 0.45$, $0.05 \leq b \leq 0.45$, $0 \leq c \leq 0.5$, $0.4 \leq d < 0.85$, and $a+b+c+d=1$. Particularly preferably, "a", "b", "c", and "d" are numbers that satisfy the following conditions: $0.05 \leq a \leq 0.4$, $0.05 \leq b \leq 0.4$, $0 \leq c \leq 0.4$, $0.45 \leq d < 0.8$, and $a+b+c+d=1$. This is because the hydrosilylation reactivity of the organopolysiloxane improves when "a" is greater than or equal to the lower limit of the range described above, and the gas permeability of the cured product is reduced when "a" is less than or equal to the upper limit of the range described above. This is also because the gas permeability of the cured product is reduced when "b" is greater than or equal to the lower limit of the range described above, and stickiness is unlikely to occur in the cured product when "b" is less than or equal to the upper limit of the range described above. This is also because the hardness of the cured product is favorable and the reliability improves when "c" is less than or equal to the upper limit of the range described above. This is also because the refractive index of the cured product is favorable when "d" is greater than or equal to the lower limit of the range described above, and the mechanical characteristics of the cured product improve when "d" is less than or equal to the upper limit of the range described above.

The organopolysiloxane of the present invention is represented by the average unit formula described above but may also have siloxane units represented by the formula: $R^2_2R^3SiO_{1/2}$, siloxane units represented by the formula: $R^2R^3_2SiO_{1/2}$, siloxane units represented by the formula: $R^3_3SiO_{1/2}$, siloxane units represented by the formula: $R^2SiO_{3/2}$, siloxane units represented by the formula: $R^4SiO_{3/2}$, or siloxane units represented by the formula: $SiO_{4/2}$ within a range that does not diminish the object of the present invention. In the formulas, $R^2$ is an alkyl group having from 1 to 12 carbons, $R^3$ is an aryl group having from 6 to 20 carbons or an aralkyl group having from 7 to 20 carbons, and $R^4$ is an alkenyl group having from 2 to 12 carbons, and examples of these groups include the same groups as those respectively described above. The organopolysiloxane of the present invention may also have silicon-bonded alkoxy group such as methoxy groups, ethoxy groups, and propoxy groups or silicon-bonded hydroxyl groups, within a range that does not diminish the object of the present invention.

An example of a method of preparing such an organopolysiloxane is a method of hydrolyzing/condensing, in the presence of an acid or an alkali, a silane compound represented by the following general formula (I):

$$R^3SiX_3$$

a disiloxane represented by the following general formula (II-1):

$$R^1_3SiOSiR^1_3$$

and/or a silane compound represented by the following general formula (II-2):

$$R^1_3SiX,$$

and a disiloxane represented by the following general formula (III-1):

$$R^2R^3R^4SiOSiR^2R^3R^4$$

and/or a silane compound represented by the following general formula (III-2):

$$R^2R^3R^4SiX.$$

The silane compound represented by the following general formula (I):

$$R^3SiX_3$$

is a raw material for introducing siloxane units represented by the formula: $R^3SiO_{3/2}$ into the organopolysiloxane. In the formulas, $R^3$ is an aryl group having from 6 to 20 carbons or an aralkyl group having from 7 to 20 carbons, and examples of these groups are synonymous with the groups described above. Of those, phenyl groups or naphthyl groups are preferable. Further, in the formula, X is an alkoxy group, an acyloxy group, a halogen atom, or a hydroxyl group.

Examples of the alkoxy group of X include a methoxy group, an ethoxy group, and a propoxy group. Examples of the acyloxy group of X include an acetoxy group. Examples of the halogen atom of X include a chlorine atom, and a bromine atom.

Examples of such a silane compound include alkoxy silanes such as phenyl trimethoxysilane, naphthyl trimethoxysilane, anthracenyl trimethoxysilane, phenanthryl trimethoxysilane, pyrenyl trimethoxysilane, phenyl triethoxysilane, naphthyl triethoxysilane, anthracenyl triethoxysilane, phenanthryl triethoxysilane, and pyrenyl triethoxysilane; acyloxysilanes such as phenyl triacetoxysilane, naphthyl triacetoxysilane, anthracenyl triacetoxysilane, phenanthryl triacetoxysilane, and pyrenyl triacetoxysilane; halosilanes such as phenyl trichlorosilane, naphthyl trichlorosilane, anthracenyl trichlorosilane, phenanthryl trichlorosilane, and pyrenyl trichlorosilane; and hydroxysilanes such as phenyl trihydroxysilane, naphthyl trihydroxysilane, anthracenyl trihydroxysilane, phenanthryl trihydroxysilane, and pyrenyl trihydroxysilane.

The disiloxane represented by the following general formula (II-1):

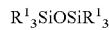

$$R^1_3SiOSiR^1_3$$

is a raw material for introducing siloxane units represented by the formula: $R^1_3SiO_{1/2}$ into the organopolysiloxane. In the formula, $R^1$ are the same or different alkyl groups having from 1 to 12 carbons or alkenyl groups having from 2 to 12 carbons. Examples of the alkyl groups of $R^1$ are synonymous with the groups described above, and, of those, methyl groups are preferable. Examples of the alkenyl groups of $R^1$ are synonymous with the groups described above, and, of those, vinyl groups are preferable.

Examples of such a disiloxane include 1,1,1,3,3,3-hexamethyldisiloxane, 1,1,1,3,3,3-hexaethyldisiloxane, 1,3-divinyl-1,1,3,3-tetramethyldisiloxane, 1,3-divinyl-1,1,3,3-tetraethyldisiloxane, 1,1,3,3-tetravinyl-1,3-dimethyldisiloxane, and 1,1,1,3,3,3-hexavinyldisiloxane. Two or more types of such disiloxanes may also be used in combination, but the combination must include at least a 1,3-dialkenyl-1,1,3,3-tetraalkyldisiloxane such as 1,3-divinyl-1,1,3,3-tetramethyldisiloxane and 1,3-divinyl-1,1,3,3-tetraethyldisiloxane.

The silane compound represented by the following general formula (II-2):

$$R^1_3SiX$$

is also a raw material for introducing siloxane units represented by the formula: $R^1_3SiO_{1/2}$ into the organopolysiloxane. In the formula, $R^1$ are the same or different alkyl groups having from 1 to 12 carbons or alkenyl groups having from 2 to 12 carbons. Examples of the alkyl groups of $R^1$ are synonymous with the groups described above, and, of those, methyl groups are preferable. Examples of the alkenyl groups of $R^1$ are synonymous with the groups described above, and, of those, vinyl groups are preferable. Moreover, in the formula, X is an alkoxy group, an acyloxy group, a halogen atom, or a hydroxyl group; and examples thereof are the same as the groups described above.

Examples of such a silane compound include alkoxysilanes such as trimethylmethoxysilane, trimethylethoxysilane, dimethylvinylmethoxysilane, diethylvinylmethoxysilane, dimethylvinylethoxysilane, diethylvinylethoxysilane, divinylmethylmethoxysilane, and trivinylmethoxysilane; acyloxysilanes such as dimethylvinylacetoxysilane, diethylvinylacetoxysilane, divinylmethylacetoxysilane, and trivinylacetoxysilane; halosilanes such as trimethylchlorosilane, dimethylvinylchlorosilane, diethylvinylchlorosilane, divinylmethylchlorosilane, and trivinylchlorosilane; and hydroxysilanes such as dimethylvinylhydroxysilane, diethylvinylhydroxysilane, divinylmethylhydroxysilane, and trivinylhydroxysilane. Two or more of such silane compounds may also be used in combination, but the combination must contain at least an alkenyl dialkylsilane compound such as dimethylvinylmethoxysilane, dimethylvinylacetoxysilane, dimethylvinylchlorosilane, and dimethylvinylhydroxysilane.

The disiloxane represented by the following general formula (III-1):

$$R^2R^3R^4SiOSiR^2R^3R^4$$

is a raw material for introducing siloxane units represented by the formula: $R^2R^3R^4SiO_{1/2}$ into the organopolysiloxane. In the formula, $R^2$ is an alkyl group having from 1 to 12 carbons, examples of which are synonymous with the groups described above, and, of those, methyl groups are preferable. In the formula, $R^3$ is an aryl group having from 6 to 20 carbons or an aralkyl group having from 7 to 20 carbons, examples of which are synonymous with the groups described above, and, of those, phenyl groups or naphthyl groups are preferable. In the formula, $R^4$ is an alkenyl group having from 2 to 12 carbons, examples of which are synonymous with the groups described above, and, of those, vinyl groups are preferable.

An example of such a disiloxane is 1,3-divinyl-1,3-diphenyl-1,3-dimethyldisiloxane.

The silane compound represented by the following general formula (III-2):

$$R^2R^3R^4SiX$$

is also a raw material for introducing siloxane units represented by the formula: $R^2R^3R^4SiO_{1/2}$ into the organopolysiloxane. In the formula, $R^2$ is an alkyl group having from 1 to 12 carbons, examples of which are synonymous with the groups described above, and, of those, methyl groups are preferable. In the formula, $R^3$ is an aryl group having from 6 to 20 carbons or an aralkyl group having from 7 to 20 carbons, examples of which are synonymous with the groups described above, and, of those, phenyl groups or naphthyl groups are preferable. In the formula, $R^4$ is an alkenyl group having from 2 to 12 carbons, examples of which are synonymous with the groups described above, and, of those, vinyl groups are preferable. Moreover, in the formula, X is an alkoxy group, an acyloxy group, a halogen atom, or a hydroxyl group; and examples thereof are the same as the groups described above.

Examples of such a silane compound include alkoxysilanes such as methylphenylvinylmethoxysilane and methylphenylvinylethoxysilane; acetoxysilanes such as methylphenylvinylacetoxysilane; chlorosilanes such as methylphenylvinylchlorosilane; and hydroxysilanes such as methylphenylvinylhydroxysilane.

In the preparation method described above, a silane compound or cyclic silicone compound for introducing siloxane units represented by the formula: $R^5_2SiO_{2/2}$ or a silane compound or silane oligomer for introducing siloxane units represented by the formula: $SiO_{4/2}$ may be reacted with the organopolysiloxane as necessary. In the formulas, $R^5$ are the same or different alkyl groups having from 1 to 12 carbons, alkenyl groups having from 2 to 12 carbons, or phenyl groups. Examples of the alkyl group of $R^5$ include the same alkyl groups described for $R^1$. Examples of the alkenyl group of $R^5$ include the same alkenyl groups described for $R^1$.

Examples of such a silane compound include alkoxysilanes such as dimethyldimethoxysilane, methylethyldimethoxysilane, methylphenyldimethoxysilane, diphenyldimethoxysilane, dimethyldiethoxysilane, methylethyldiethoxysilane, methylphenyldiethoxysilane, diphenyldiethoxysilane, tetramethoxysilane, and tetraethoxysilane; acetoxysilanes such as dimethyldiacetoxysilane, methylphenyldiaacetoxysilane, diphenyldiacetoxysilane, and tetraacetoxysilane; halosilanes such as dimethyldichlorosilane, methylphenyldichlorosilane, diphenyldichlorosilane, and tetrachlorosilane; and hydroxysilanes such as dimethyldihydroxysilane, methylphenyldihydroxysilane, and diphenyldihydroxysilane. Examples of such a cyclic silicone compound include cyclic dimethylsiloxane oligomers, cyclic phenylmethylsiloxane oligomers, and cyclic diphenylsiloxane oligomers. Further, examples of silane oligomers include partial hydrolysates of tetramethoxysilane and partial hydrolysates of tetraethoxysilane.

The preparation method described above is characterized in that the silane compound (I), the disiloxane (II-1) and/or the silane compound (II-2), and the disiloxane (III-1) and/or the silane compound (III-2) as well as other silane compounds, cyclic silicone compounds, or silane oligomers, if necessary, are hydrolyzed/condensed in the presence of an acid or an alkali.

Acids that may be used are exemplified by hydrochloric acid, acetic acid, formic acid, nitric acid, oxalic acid, sulfuric acid, phosphoric acid, polyphosphoric acid, polycarboxylic acid, trifluoromethane sulfonic acid, and ion exchange resins. Further, the utilized base is exemplified by inorganic bases such as potassium hydroxide, sodium hydroxide, and the like; and organic base compounds such as triethylamine, diethylamine, monoethanolamine, diethanolamine, triethanolamine, ammonia water, tetramethylammonium hydroxide, alkoxysilanes having an amino group, aminopropyltrimethoxysilane, and the like.

Furthermore, an organic solvent may be used in the preparation method. The utilized organic solvent is exemplified by ethers, ketones, acetates, aromatic or aliphatic hydrocarbons, and a γ-butyrolactone; and mixtures of two or more types of such solvents. Preferred organic solvents are exemplified by propylene glycol monomethyl ether, propylene glycol monomethyl ether acetate, propylene glycol monoethyl ether, propylene glycol monopropyl ether, propylene glycol monobutyl ether, propylene glycol mono-t-butyl ether, γ-butyrolactone, toluene, and xylene.

In order to accelerate the hydrolysis and condensation reaction of each of the components in the preparation method, water or a mixed solution of water and alcohol is preferably added. Methanol and ethanol are preferred examples of the alcohol. This reaction is promoted by heating, and if an organic solvent is used, the reaction is preferably performed at the reflux temperature of the organic solvent.

Such an organopolysiloxane of the present invention has favorable hydrosilylation reactivity, so a hydrosilylation reaction-curable silicone composition can be prepared by using this as a base compound and adding an organopolysiloxane having at least two silicon-bonded hydrogen atoms in a molecule and a hydrosilylation reaction catalyst.

Next, the curable silicone composition of the present invention will be explained in detail.

The curable silicone composition of the present invention is characterized in that it comprises components (A) to (D) described above. The organopolysiloxane for component (A) is as described above.

Component (B), which is an optional component for imparting the cured product with softness, extensibility, and flexibility, is a straight-chain organopolysiloxane having at least two alkenyl groups and not having any silicon-bonded hydrogen atoms in a molecule. Examples of the alkenyl groups in component (B) include alkenyl groups having from 2 to 12 carbons such as vinyl groups, allyl groups, butenyl groups, pentenyl groups, hexenyl groups, heptenyl groups, octenyl groups, nonenyl groups, decenyl groups, undecenyl groups, and dodecenyl groups, and vinyl groups are preferable. Examples of groups bonding to silicon atoms other than alkenyl groups in component (B) include alkyl groups having from 1 to 12 carbons such as methyl groups, ethyl groups, propyl groups, butyl groups, pentyl groups, hexyl groups, heptyl groups, octyl groups, nonyl groups, decyl groups, undecyl groups, and dodecyl groups; aryl groups having from 6 to 20 carbons such as phenyl groups, tolyl groups, xylyl groups, naphthyl groups, anthracenyl groups, phenanthryl groups, pyrenyl groups, and groups in which the hydrogen atoms of these aryl groups are substituted with alkyl groups such as methyl groups and ethyl groups, alkoxy groups such as methoxy groups and ethoxy groups, or halogen atoms such as chlorine atoms and bromine atoms; aralkyl groups having from 7 to 20 carbons such as benzyl groups, phenethyl groups, naphthyl ethyl groups, naphthyl propyl groups, anthracenyl ethyl groups, phenanthryl ethyl groups, pyrenyl ethyl groups, and groups in which the hydrogen atoms of these aralkyl groups are substituted with alkyl groups such as methyl groups and ethyl groups, alkoxy groups such as methoxy groups and ethoxy groups, or halogen atoms such as chlorine atoms and bromine atoms; and halogenated alkyl groups having from 1 to 12 carbons such as chloromethyl groups and 3,3,3-trifluoropropyl groups. Examples of the respective groups are synonymous with the groups described above, and methyl groups and phenyl groups are preferable.

Examples of such component (B) include copolymers of dimethylsiloxane and methylvinylsiloxane capped at both molecular terminals with trimethylsiloxy groups, methylvinylpolysiloxanes capped at both molecular terminals with trimethylsiloxy groups, copolymers of dimethylsiloxane, methylvinylsiloxane, and methylphenylsiloxane capped at both molecular terminals with trimethylsiloxy groups, dimethylpolysiloxanes capped at both molecular terminals with dimethylvinylsiloxy groups, methylvinylpolysiloxanes capped at both molecular terminals with dimethylvinylsiloxy groups, copolymers of dimethylsiloxane and methylvinylsiloxane capped at both molecular terminals with dimethylvinylsiloxy groups, copolymers of dimethylsiloxane, methylvinylsiloxane, and methylphenylsiloxane capped at both molecular terminals with dimethylvinylsiloxy groups, and mixtures of two or more types of these organopolysiloxanes.

The content of component (B) in this composition is in the range of 0 to 70 mass %, preferably in the range of 0 to 50 mass %, and particularly preferably in the range of 0 to 40 mass % with respect to this composition. This is because when the content of component (B) is less than or equal to the upper limit of the range described above, it is possible to impart the cured product with softness, extensibility, and flexibility without increasing the gas permeability of the cured product, thus making it possible to improve the reliability of an optical semiconductor device produced using this composition.

Component (C) is a crosslinking agent of the present composition and is an organopolysiloxane having at least 2 silicon-bonded hydrogen atoms in a molecule. Examples of the bond positions of the silicon-bonded hydrogen atoms in component (C) are molecular chain terminals and/or molecular side chains. Examples of other groups bonding to silicon atoms in component (C) include alkyl groups having from 1 to 12 carbons such as methyl groups, ethyl groups, propyl groups, butyl groups, pentyl groups, hexyl groups, heptyl groups, octyl groups, nonyl groups, decyl groups, undecyl groups, and dodecyl groups; aryl groups having from 6 to 20 carbons such as phenyl groups, tolyl groups, xylyl groups, naphthyl groups, anthracenyl groups, phenanthryl groups, pyrenyl groups, and groups in which the hydrogen atoms of these aryl groups are substituted with alkyl groups such as methyl groups and ethyl groups, alkoxy groups such as methoxy groups and ethoxy groups, or halogen atoms such as chlorine atoms and bromine atoms; aralkyl groups having from 7 to 20 carbons such as benzyl groups, phenethyl groups, naphthyl ethyl groups, naphthyl propyl groups, anthracenyl ethyl groups, phenanthryl ethyl groups, pyrenyl ethyl groups, and groups in which the hydrogen atoms of these aralkyl groups are substituted with alkyl groups such as methyl groups and ethyl groups, alkoxy groups such as methoxy groups and ethoxy groups, or halogen atoms such as chlorine atoms and bromine atoms; and halogenated alkyl groups having from 1 to 12 carbons such as chloromethyl groups and 3,3,3-trifluoropropyl groups. Examples of the respective groups are synonymous with the groups described above, and, of these, methyl groups and phenyl groups are preferable. Component (C) may have a straight, branched, cyclic, net-like, or a partially branched straight chain molecular structure.

This type of component (C) is exemplified by a methylhydrogenpolysiloxane capped at both molecular terminals with trimethylsiloxy groups, a copolymer of dimethylsiloxane and methyl hydrogen siloxane capped at both molecular terminals with trimethylsiloxy groups, a copolymer of dimethylsiloxane, methylhydrogensiloxane, and methylphenylsiloxane capped at both molecular terminals with trimethylsiloxy groups, a dimethylpolysiloxane capped at both molecular terminals with dimethylhydrogensiloxy groups, a copolymer of dimethylsiloxane and methylphenylsiloxane capped at both molecular terminals with dimethylhydrogensiloxy groups, a methylphenylpolysiloxane capped at both molecular terminals with dimethylhydrogensiloxy groups, organopolysiloxane copolymers composed of siloxane units represented by the general formula: $R'_3SiO_{1/2}$ and siloxane units represented by the general formula: $R'_2HSiO_{1/2}$ and siloxane units represented by the formula: $SiO_{4/2}$, organopolysiloxane copolymers composed of siloxane units represented by the general formula: $R'_2HSiO_{1/2}$ and siloxane units represented by the formula: $SiO_{4/2}$, organopolysiloxane copolymers composed of siloxane units represented by the general formula: $R'HSiO_{2/2}$, and siloxane units represented by the general formula: $R'SiO_{3/2}$ or siloxane units represented by the formula: $HSiO_{3/2}$, and mixtures of two or more such organopolysiloxanes. In the formulas, R' is an alkyl group having from 1 to 12 carbons, an aryl group having from 6 to 20 carbons, an aralkyl group having from 7 to 20 carbons, or a halogenated alkyl group having from 1 to 12 carbons, examples of which include the same groups as those respectively described above.

The content of component (C) in the present composition, per 1 mol of total alkenyl groups in components (A) and (B), is in a range such that the silicon-bonded hydrogen atoms in component (C) is in a range of 0.1 to 5 mol, and preferably in a range of 0.5 to 2 mol. This is because when the content of component (C) is greater than or equal to the lower limit of the range described above, the composition is cured sufficiently, and when the content is less than or equal to the upper limit of the range described above, the heat resistance of the cured product improves, thus making it possible to improve the reliability of an optical semiconductor device produced using this composition.

Component (D) is a hydrosilylation reaction catalyst for accelerating the curing of this composition, and examples include platinum-based catalysts, rhodium-based catalysts, and palladium-based catalysts. Particularly, component (D) is preferably a platinum-based catalyst so that the curing of the present composition can be dramatically accelerated. Examples of the platinum-based catalyst include a platinum fine powder, chloroplatinic acid, an alcohol solution of chloroplatinic acid, a platinum-alkenylsiloxane complex, a platinum-olefin complex and a platinum-carbonyl complex, with a platinum-alkenylsiloxane complex being preferred.

The content of component (D) in this composition is an effective amount for accelerating the curing of the composition. Specifically, in order to be able to sufficiently accelerate the curing reaction of this composition, the content of component (D) is preferably an amount so that the catalyst metal in component (D) is in the range of 0.01 to 500 ppm, more preferably in the range of 0.01 to 100 ppm, and particularly preferably in the range of 0.01 to 50 ppm in mass units with respect to this composition.

This composition may also contain (E) an adhesion-imparting agent in order to improve the adhesiveness of the cured product with respect to the base material with which the composition makes contact during the course of curing. Preferred component (E) are organosilicon compounds having at least one alkoxy group bonded to a silicon atom in a molecule. This alkoxy group is exemplified by a methoxy group, an ethoxy group, a propoxy group, a butoxy group, and a methoxyethoxy group; and the methoxy group is particularly preferred. Moreover, non-alkoxy groups bonded to a silicon atom of this organosilicon compound are exemplified by substituted or unsubstituted monovalent hydrocarbon groups such as alkyl groups, alkenyl groups, aryl groups, aralkyl groups, halogenated alkyl groups and the like; epoxy group-containing monovalent organic groups such as 3-glycidoxypropyl groups, 4-glycidoxybutyl groups, or similar glycidoxyalkyl groups; 2-(3,4-epoxycyclohexyl)ethyl groups, 3-(3,4-epoxycyclohexyl)propyl groups, or similar epoxycyclohexylalkyl groups; or 4-oxiranylbutyl groups, 8-oxiranyloctyl group, or similar oxiranylalkyl groups; acrylic group-containing monovalent organic groups such as 3-methacryloxypropyl groups and the like; and hydrogen atoms. This organosilicon compound preferably has a silicon-bonded alkenyl group or silicon-bonded hydrogen atom. Moreover, due to the ability to impart good adhesion with respect to various types of substrates, this organosilicon compound preferably has at least one epoxy group-containing monovalent organic group in a molecule. This type of organosilicon compound is exemplified by organosilane compounds, organosiloxane oligomers and alkyl silicates. Molecular structure of the organosiloxane oligomer or alkyl silicate is exemplified by a straight structure, partially branched straight structure, branched chain structure, ring-shaped structure, and net-shaped structure. A straight chain structure, branched chain structure, and net-shaped structure are particularly preferred. This type of organosilicon compound is exemplified by silane compounds such as 3-glycidoxypropyltrimethoxysilane, 2-(3,4-epoxycyclohexyl)ethyltrimethoxysilane, 3-methacryloxy propyltrimethoxysilane, and the like; siloxane compounds having at least one of silicon-bonded alkenyl groups and silicon-bonded hydrogen atoms, and at least one silicon-bonded alkoxy group in a molecule; mixtures of a silane compound or siloxane compound having at least one silicon-bonded alkoxy group and a siloxane compound having at least one silicon-bonded hydroxyl group and at least one silicon-bonded alkenyl group in a molecule; and methyl polysilicate, ethyl polysilicate, and epoxy group-containing ethyl polysilicate.

The content of component (E) is not particularly limited but is preferably in the range of 0.01 to 10 parts by mass with respect to a total of 100 parts by mass of components (A) to (D) described above so as to ensure favorable adhesion to the base material with which the composition makes contact during the course of curing.

A reaction inhibitor, for example, an alkyne alcohol such as 2-methyl-3-butyn-2-ol, 3,5-dimethyl-1-hexyn-3-ol and 2-phenyl-3-butyn-2-ol; an ene-yne compound such as 3-methyl-3-penten-1-yne and 3,5-dimethyl-3-hexen-1-yne; or 1,3,5,7-tetramethyl-1,3,5,7-tetravinylcyclotetrasiloxane, 1,3,5,7-tetramethyl-1,3,5,7-tetrahexenylcyclotetrasiloxane or a benzotriazole may be incorporated as an optional component in the present composition. The content of the reaction inhibitor in this composition is not particularly limited but is preferably in the range of 0.0001 to 5 parts by mass with respect to a total of 100 parts by mass of components (A) to (D) described above.

This composition may also contain a fluorescent substance as an optional component. This fluorescent substance is exemplified by substances widely used in light emitting diodes (LEDs), such as yellow, red, green, and blue light-emitting fluorescent substances such as oxide fluorescent substances, oxynitride fluorescent substances, nitride fluorescent substances, sulfide fluorescent substances, oxysulfide fluorescent substances, and the like. Examples of oxide fluorescent substances include yttrium, aluminum, and garnet-type YAG green to yellow light-emitting fluorescent substances containing cerium ions; terbium, aluminum, and garnet-type TAG yellow light-emitting fluorescent substances containing cerium ions; and silicate green to yellow light-emitting fluorescent substances containing cerium or europium ions. Examples of oxynitride fluorescent substances include silicon, aluminum, oxygen, and nitrogen-type SiAlON red to green light-emitting fluorescent substances containing europium ions. Examples of nitride fluorescent substances include calcium, strontium, aluminum, silicon, and nitrogen-type CASN red light-emitting fluorescent substances containing europium ions. Examples of sulfide fluorescent substances include ZnS green light-emitting fluorescent substances containing copper ions or aluminum ions. Examples of oxysulfide fluorescent substances include $Y_2O_2S$ red light-emitting fluorescent substances containing europium ions. These fluorescent substances may be used as one type or as a mixture of two or more types. The content of the fluorescent substance in this composition is not particularly limited but is preferably in the range of 0.1 to 70 mass % and more preferably in the range of 1 to 20 mass % in this composition.

Moreover, an inorganic filler such as silica, glass, alumina or zinc oxide; an organic resin fine powder of a polymethacrylate resin and the like; a heat-resistant agent, a dye, a pigment, a flame retardant, a solvent and the like may be incorporated as optional components in the present composition at levels that do not impair the objective of the present invention.

The present composition is such that curing occurs either at room temperature or under heating, but it is preferable to heat the composition in order to achieve rapid curing. The heating temperature is preferably from 50 to 200° C.

The cured product of the present invention will now be described in detail.

The cured product of the present invention is formed by curing the aforementioned curable silicone composition. The shape of the cured product is not particularly limited, and examples include a sheet shape and a film shape. The cured product can be handled as a simple substance or may also be handled in a state in which the cured product covers or seals an optical semiconductor element or the like.

The optical semiconductor device of the present invention will now be explained in detail.

The optical semiconductor device of the present invention is produced by sealing an optical semiconductor element with a cured product of the curable silicone composition described above. Examples of such an optical semiconductor device of the present invention include a light emitting diode (LED), a photocoupler, and a CCD. Examples of optical semiconductor elements include light emitting diode (LED) chips and solid-state image sensing devices.

FIG. 1 illustrates a cross-sectional view of a single surface mounted type LED, which is one example of the optical semiconductor device of the present invention. In the LED illustrated in FIG. 1, an LED chip 1 is die-bonded to a lead frame 2, and the LED chip 1 and a lead frame 3 are wire-bonded by a bonding wire 4. A frame material 5 is provided around this LED chip 1, and the LED chip 1 inside the frame material 5 is sealed by a cured product 6 of the curable silicone composition of the present invention.

An example of a method of producing the surface mounted type LED illustrated in FIG. 1 is a method of die-bonding the LED chip 1 to the lead frame 2, wire-bonding the LED chip 1 and the lead frame 3 with a gold bonding wire 4, filling the inside of the frame material 5 provided around the LED chip 1 with the curable silicone composition of the present invention, and then curing the composition by heating at 50 to 200° C.

EXAMPLES

The organopolysiloxane, the curable silicone composition, the cured product thereof, and the optical semiconductor device of the present invention will be described in detail hereinafter using practical examples. The viscosity is the value at 25° C. In the practical examples, Me represents methyl groups, Vi represents vinyl groups, Ph represents phenyl groups, Naph represents naphthyl groups, and Ep represents 3-glycidoxypropyl groups. The characteristics of the curable silicone composition, the cured product thereof, and the optical semiconductor device were measured as follows.

[Evaluation of Curability]

A cured product was prepared by placing approximately 0.5 g of the curable silicone composition in an aluminum cup and heating the composition for 2 minutes in a circulating hot air oven at 150° C. The cured product was cooled to room temperature immediately thereafter, and the surface was touched with a finger to evaluate the curability based on the presence or absence of tackiness on the surface. In addition, the curing speed was evaluated from the heat generation peak temperature of the curable silicone composition when measured at a heating rate of 10° C./min using a Curelastometer (DSC7000 manufactured by SII Nanotechnology Inc.).

[Water Vapor Permeability of the Cured Product]

A cured film with a thickness of 1 mm was prepared by curing the curable silicone composition for 2 hours at 150° C. using a press. The water vapor permeability of the cured film was measured in accordance with the cup method of JIS Z0208 under conditions with a temperature of 40° C. and 90% relative humidity.

[Reliability of the Optical Semiconductor Device]

The optical semiconductor device illustrated in FIG. 1 was produced by heating the curable silicone composition for 2 hours at 150° C. This optical semiconductor device was subjected to 24-hour exposure tests under conditions with a temperature of 50° C., 75% relative humidity, and a hydrogen sulfide gas concentration of 20 ppm. The reliability of the optical semiconductor device was evaluated by measuring changes in the luminous efficiency of the optical semiconductor device before and after the exposure tests.

Reference Example 1

First, 82.2 g of 1,3-divinyl-1,1,3,3-tetramethyldisiloxane, 143 g of water, 0.38 g of trifluoromethane sulfonic acid, and 500 g of toluene were loaded into a 4-necked flask with an agitator, a refluxing cooler, and a thermometer, and 524.7 g of phenyltrimethoxysilane was dripped into the mixture over the course of one hour while stirring. After dripping was complete, the mixture was heat-refluxed for one hour. The mixture was then cooled, and after the bottom layer was separated, the toluene solution layer was washed with water three times. Next, 314 g of methyl glycidoxypropyl dimethoxysilane, 130 g of water, and 0.50 g of potassium hydroxide were added to the water-washed toluene solution layer, and the mixture was heat-refluxed for one hour. Methanol was then distilled off, and the excess water was removed by azeotropic dehydration. After heat-refluxing for 4 hours, the toluene solution was cooled, neutralized with 0.55 g of acetic acid, and washed 3 times with water. After the water was removed, the toluene was distilled off under reduced pressure to prepare an adhesion-imparting agent with a viscosity of 8,500 mPa·s represented by the following average unit formula:

$(ViMe_2SiO_{1/2})_{0.18}(PhSiO_{3/2})_{0.53}(EpMeSiO_{2/2})_{0.29}$

Practical Example 1

First, 400 g (2.02 mol) of phenyltrimethoxysilane, 84.86 g (0.27 mol) of 1,3-divinyl-1,3-diphenyldimethyldisiloxane, and 3.64 g (0.02 mol) of 1,3-divinyltetramethyldisiloxane were loaded into a reaction vessel and mixed in advance. Next, 3.47 g (23 mmol) of trifluoromethane sulfonic acid was added, and 120 g (6.6 mol) of water was added and heat-refluxed for 2 hours while stirring. The mixture was then distilled at atmospheric pressure by heating until the mixture reached 85° C. Next, 87.6 g of toluene and 1.82 g (32.5 mmol) of potassium hydroxide were added, and after the mixture was distilled at atmospheric pressure by heating until the reaction temperature reached 120° C., the mixture was reacted for 8 hours at this temperature. The mixture was then cooled to room temperature, and a neutralization reaction was performed by adding 0.67 g (11.2 mmol) of acetic acid. The generated salt was removed by filtration. The low boiling point substances were removed from the obtained transparent solution by heating under vacuum to obtain 343 g (98% yield) of a colorless transparent gum-like viscous liquid.

As a result of nuclear magnetic resonance spectroscopy (hereafter called NMR analysis), it was observed that this liquid was an organopolysiloxane represented by the following average unit formula:

$(MePhViSiO_{1/2})_{0.210}(Me_2ViSiO_{1/2})_{0.015}(PhSiO_{3/2})_{0.775}.$

The mass average molecular weight (Mw) of this organopolysiloxane was 1,439, and the dispersity (Mw/Mn) was 1.22.

Practical Example 2

First, 470 g (2.37 mol) of phenyltrimethoxysilane, 87.93 g (0.28 mol) of 1,3-divinyl-1,3-diphenyldimethyldisiloxane, and 13.20 g (0.07 mol) of 1,3-divinyltetramethyldisiloxane were loaded into a reaction vessel and mixed in advance. Next, 4.09 g (27 mmol) of trifluoromethane sulfonic acid was added, and 140.8 g (7.8 mol) of water was added and heat-refluxed for 2 hours while stirring. The mixture was then distilled at atmospheric pressure by heating until the mixture reached 85° C. Next, 102 g of toluene and 2.14 g (38.1 mmol) of potassium hydroxide were added, and after the mixture was distilled at atmospheric pressure by heating until the reaction temperature reached 120° C., the mixture was reacted for 8 hours at this temperature. The mixture was then cooled to room temperature, and a neutralization reaction was performed by adding 0.78 g (13.1 mmol) of acetic acid. The generated salt was removed by filtration. The low boiling point substances were removed from the obtained transparent solution by heating under vacuum to obtain 400 g (98% yield) of a colorless transparent gum-like viscous liquid.

As a result of NMR analysis, this liquid was found to be the organopolysiloxane represented by the following average unit formula:

$(MePhViSiO_{1/2})_{0.184}(Me_2ViSiO_{1/2})_{0.046}(PhSiO_{3/2})_{0.77}.$

The mass average molecular weight (Mw) of this organopolysiloxane was 1,376, and the dispersity (Mw/Mn) was 1.16.

Practical Example 3

First, 470 g (2.37 mol) of phenyltrimethoxysilane, 65.95 g (0.21 mol) of 1,3-divinyl-1,3-diphenyldimethyldisiloxane, and 26.39 g (0.14 mol) of 1,3-divinyltetramethyldisiloxane were loaded into a reaction vessel and mixed in advance. Next, 4.09 g (27 mmol) of trifluoromethane sulfonic acid was added, and 140.8 g (7.8 mol) of water was added and heat-refluxed for 2 hours while stirring. The mixture was then distilled at atmospheric pressure by heating until the mixture reached 85° C. Next, 100 g of toluene and 2.13 g (37.9 mmol) of potassium hydroxide were added, and after the mixture was distilled at atmospheric pressure by heating until the reaction temperature reached 120° C., the mixture was reacted for 10 hours at this temperature. The mixture was then cooled to room temperature, and a neutralization reaction was performed by adding 0.77 g (12.8 mmol) of acetic acid. The generated salt was removed by filtration. The low boiling point substances were removed from the obtained transparent solution by heating under vacuum to obtain 391 g (98% yield) of a colorless transparent gum-like viscous liquid.

As a result of NMR analysis, this liquid was found to be the organopolysiloxane represented by the following average unit formula:

$(MePhViSiO_{1/2})_{0.138}(Me_2ViSiO_{1/2})_{0.092}(PhSiO_{3/2})_{0.77}.$

The mass average molecular weight (Mw) of this organopolysiloxane was 1,786, and the dispersity (Mw/Mn) was 1.15.

Practical Example 4

First, 148.8 g (0.6 mol) of 1-naphthyltrimethoxysilane, 49.6 g (0.16 mol) of 1,3-divinyl-1,3-diphenyldimethyldisiloxane, and 7.44 g (0.04 mol) of 1,3-divinyltetramethyldisiloxane were loaded into a reaction vessel and mixed in advance. Next, 1.002 g (6.7 mmol) of trifluoromethane sulfonic acid was added, and 32.4 g (1.8 mol) of water was added and heat-refluxed for 2 hours while stirring. The mixture was then distilled at atmospheric pressure by heating until the mixture reached 85° C. Next, 70.5 g of toluene and 0.538 g (9.6 mmol) of potassium hydroxide were added, and after the mixture was distilled at atmospheric pressure by heating until the reaction temperature reached 120° C., the mixture was reacted for 6 hours at this temperature. The mixture was then cooled to room temperature, and a neutralization reaction was performed by adding 0.577 g (9.6 mmol) of acetic acid. The generated salt was removed by filtration. The low boiling point substances were removed from the obtained transparent solution by heating under vacuum to obtain 152.4 g (92.7% yield) of a colorless transparent gum-like viscous liquid.

As a result of NMR analysis, this liquid was found to be the organopolysiloxane represented by the following average unit formula:

$$(MePhViSiO_{1/2})_{0.32}(Me_2ViSiO_{1/2})_{0.08}(NaphSiO_{3/2})_{0.60}.$$

The mass average molecular weight (Mw) of this organopolysiloxane was 960, and the dispersity (Mw/Mn) was 1.02. The refractive index was 1.619.

Practical Example 5

First, 148.8 g (0.6 mol) of 1-naphthyltrimethoxysilane, 37.2 g (0.12 mol) of 1,3-divinyl-1,3-diphenyldimethyldisiloxane, and 14.9 g (0.08 mol) of 1,3-divinyltetramethyldisiloxane were loaded into a reaction vessel and mixed in advance. Next, 0.978 g (6.5 mmol) of trifluoromethane sulfonic acid was added, and 35.6 g (1.98 mol) of water was added and heat-refluxed for 2 hours while stirring. The mixture was then distilled at atmospheric pressure by heating until the mixture reached 85° C. Next, 69.1 g of toluene and 0.525 g (9.4 mmol) of potassium hydroxide were added, and after the mixture was distilled at atmospheric pressure by heating until the reaction temperature reached 120° C., the mixture was reacted for 6 hours at this temperature. The mixture was then cooled to room temperature, and a neutralization reaction was performed by adding 0.57 g (9.5 mmol) of acetic acid. The generated salt was removed by filtration. The low boiling point substances were removed from the obtained transparent solution by heating under vacuum to obtain 141.9 g (89.0% yield) of a colorless transparent gum-like viscous liquid.

As a result of NMR analysis, this liquid was found to be the organopolysiloxane represented by the following average unit formula:

$$(MePhViSiO_{1/2})_{0.24}(Me_2ViSiO_{1/2})_{0.16}(NaphSiO_{3/2})_{0.60}.$$

The mass average molecular weight (Mw) of this organopolysiloxane was 980, and the dispersity (Mw/Mn) was 1.02. The refractive index was 1.617.

Practical Example 6

First, 150 g (0.76 mol) of phenyltrimethoxysilane, 52.47 g (0.17 mol) of 1,3-divinyl-1,3-diphenyldimethyldisiloxane, 3.0 g (0.016 mol) of 1,3-divinyltetramethyldisiloxane, and 146.78 g (0.48 mol) of diphenyldimethoxysilane were loaded into a reaction vessel and mixed in advance. Next, 2.14 g (19 mmol) of trifluoromethane sulfonic acid was added, and 64.1 g (3.6 mol) of water was added and heat-refluxed for 2 hours while stirring. The mixture was then distilled at atmospheric pressure by heating until the mixture reached 85° C. Next, 28 g of toluene and 1.17 g (20.9 mmol) of potassium hydroxide were added, and after the mixture was distilled at atmospheric pressure by heating until the reaction temperature reached 120° C., the mixture was reacted for 8 hours at this temperature. The mixture was then cooled to room temperature, and a neutralization reaction was performed by adding 0.48 g (8.0 mmol) of acetic acid. The generated salt was removed by filtration. The low boiling point substances were removed from the obtained transparent solution by heating under vacuum to obtain 244 g (98% yield) of a colorless transparent gum-like viscous liquid.

As a result of NMR analysis, this liquid was found to be the organopolysiloxane represented by the following average unit formula:

$$(MePhViSiO_{1/2})_{0.21}(Me_2ViSiO_{1/2})_{0.02}(Ph_2SiO_{1/2})_{0.30}(PhSiO_{3/2})_{0.47}.$$

The mass average molecular weight (Mw) of this organopolysiloxane was 1,103, and the dispersity (Mw/Mn) was 1.18.

Comparative Example 1

First, 400 g (2.02 mol) of phenyltrimethoxysilane and 93.5 g (0.30 mol) of 1,3-divinyl-1,3-diphenyldimethyldisiloxane were loaded into a reaction vessel and mixed in advance. Next, 1.74 g (11.6 mmol) of trifluoromethane sulfonic acid was added, and 110 g (6.1 mol) of water was added and heat-refluxed for 2 hours while stirring. The mixture was then distilled at atmospheric pressure by heating until the mixture reached 85° C. Next, 89 g of toluene and 1.18 g (21.1 mmol) of potassium hydroxide were added, and after the mixture was distilled at atmospheric pressure by heating until the reaction temperature reached 120° C., the mixture was reacted for 6 hours at this temperature. The mixture was then cooled to room temperature, and a neutralization reaction was performed by adding 0.68 g (11.4 mmol) of acetic acid. The generated salt was removed by filtration. The low boiling point substances were removed from the obtained transparent solution by heating under vacuum to obtain 347 g (98% yield) of a colorless transparent gum-like viscous liquid.

As a result of NMR analysis, this liquid was found to be the organopolysiloxane represented by the following average unit formula:

$$(MePhViSiO_{1/2})_{0.23}(PhSiO_{3/2})_{0.77}.$$

The mass average molecular weight (Mw) of this organopolysiloxane was 1,617, and the dispersity (Mw/Mn) was 1.16.

Comparative Example 2

First, 400 g (2.02 mmol) of phenyltrimethoxysilane and 56.2 g (0.30 mol) of 1,3-divinyl-tetramethyldisiloxane were loaded into a reaction vessel and mixed in advance. Next, 0.35 g (2.3 mmol) of trifluoromethane sulfonic acid was added, and 120 g (6.65 mol) of water was added and heat-refluxed for 2 hours while stirring. The mixture was then distilled at atmospheric pressure by heating until the mixture reached 85° C. Next, 80 g of toluene and 0.61 g (10.8 mmol) of potassium hydroxide were added, and after the mixture was distilled at atmospheric pressure by heating until the reaction temperature reached 120° C., the mixture was reacted for 6 hours at this temperature. The mixture was then cooled to room temperature, and a neutralization reaction was performed by adding 0.61 g (10.2 mmol) of acetic acid. The generated salt was removed by filtration. The low boiling point substances were removed from the obtained transparent solution by heating under vacuum to obtain 310 g (98% yield) of a colorless transparent gum-like viscous liquid.

As a result of NMR analysis, this liquid was found to be the organopolysiloxane represented by the following average unit formula:

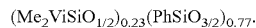

$(Me_2ViSiO_{1/2})_{0.23}(PhSiO_{3/2})_{0.77}$.

The mass average molecular weight (Mw) of this organopolysiloxane was 1,375, and the dispersity (Mw/Mn) was 1.17.

Comparative Example 3

First, 892.8 g (3.6 mol) of 1-naphthyltrimethoxysilane and 372.0 g (1.2 mol) of 1,3-divinyl-1,3-diphenyldimethyldisiloxane were loaded into a reaction vessel and mixed in advance. Next, 6.15 g (41 mmol) of trifluoromethane sulfonic acid was added, and 213.84 g (11.88 mol) of water was added and heat-refluxed for 2 hours while stirring. The mixture was then distilled at atmospheric pressure by heating until the mixture reached 85° C. Next, 435.6 g of toluene and 3.28 g (58.6 mmol) of potassium hydroxide were added, and after the mixture was distilled at atmospheric pressure by heating until the reaction temperature reached 120° C., the mixture was reacted for 6 hours at this temperature. The mixture was then cooled to room temperature, and a neutralization reaction was performed by adding 3.524 g (58.7 mmol) of acetic acid. The generated salt was removed by filtration. The low boiling point substances were removed from the obtained transparent solution by heating under vacuum to obtain 957.4 g (94.2% yield) of a colorless transparent gum-like viscous liquid.

As a result of NMR analysis, this liquid was found to be the organopolysiloxane represented by the following average unit formula:

$(MePhViSiO_{1/2})_{0.40}(NaphSiO_{3/2})_{0.60}$.

The mass average molecular weight (Mw) of this organopolysiloxane was 1,000, and the dispersity (Mw/Mn) was 1.02. The refractive index was 1.621.

Practical Example 7

A curable silicone composition was prepared by mixing 78.2 parts by mass of the organopolysiloxane prepared in Practical Example 1, 21.8 parts by mass of an organotrisiloxane represented by the following formula:

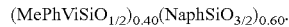

$HMe_2SiOPh_2SiOSiMe_2H$ (in an amount that the amount of silicon-bonded hydrogen atoms in this component is 1 mol per 1 mol of vinyl groups in the organopolysiloxane described above), 2 parts by mass of the adhesion-imparting agent prepared in Reference Example 1, and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. was sufficiently cured with no surface tackiness. The DSC heat generation peak temperature of this curable silicone composition was 114° C. The water vapor permeability of the cured product was 8.1 g/m²·24 h.

Practical Example 8

A curable silicone composition with a viscosity of 8,000 mPa·s was prepared by mixing 77.7 parts by mass of the organopolysiloxane prepared in Practical Example 2, 22.3 parts by mass of an organotrisiloxane represented by the following formula:

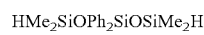

$HMe_2SiOPh_2SiOSiMe_2H$ (in an amount that the amount of silicon-bonded hydrogen atoms in this component is 1 mol per 1 mol of vinyl groups in the organopolysiloxane described above), 2 parts by mass of the adhesion-imparting agent prepared in Reference Example 1, and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. was sufficiently cured with no surface tackiness. The DSC heat generation peak temperature of this curable silicone composition was 109° C. The water vapor permeability of the cured product was 9.4 g/m²·24 h.

Practical Example 9

A curable silicone composition with a viscosity of 4,500 mPa·s was prepared by mixing 63.7 parts by mass of the organopolysiloxane prepared in Practical Example 2, 15.2 parts by mass of a methylphenylpolysiloxane capped at both molecular terminals with dimethylvinylsiloxy groups having a viscosity of 3,000 mPa·s, 21.1 parts by mass of an organotrisiloxane represented by the following formula:

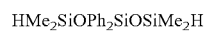

$HMe_2SiOPh_2SiOSiMe_2H$ (in an amount that the amount of silicon-bonded hydrogen atoms in this component is 1 mol per 1 mol of the total vinyl groups in the organopolysiloxane and the methylphenylpolysiloxane described above), and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. was sufficiently cured with no surface tackiness. The DSC heat generation peak temperature of this curable silicone composition was 107° C. The water vapor permeability of the cured product was 11 g/m²·24 h.

Practical Example 10

A curable silicone composition was prepared by mixing 64.6 parts by mass of the organopolysiloxane prepared in Practical Example 2, 15.2 parts by mass of a methylphenylpolysiloxane capped at both molecular terminals with dimethylvinylsiloxy groups having a viscosity of 3,000 mPa·s, 18.4 parts by mass of an organotrisiloxane represented by the following formula:

HMe$_2$SiOPh$_2$SiOSiMe$_2$H (in an amount that the amount of silicon-bonded hydrogen atoms in this component is 0.5 mol per 1 mol of the total vinyl groups in the organopolysiloxane and the methylphenylpolysiloxane described above), 1.8 parts by mass of an organopolysiloxane represented by the following average unit formula:

(HMe$_2$SiO$_{1/2}$)$_{0.60}$(PhSiO$_{3/2}$)$_{0.40}$ (in an amount that the amount of silicon-bonded hydrogen atoms in this component is 0.5 mol per 1 mol of the total vinyl groups in the organopolysiloxane and the methylphenylpolysiloxane described above), and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. was sufficiently cured with no surface tackiness. The water vapor permeability of the cured product was 10.5 g/m$^2$·24 h.

Practical Example 11

A curable silicone composition was prepared by mixing 64.2 parts by mass of the organopolysiloxane prepared in Practical Example 3, 15.2 parts by mass of a methylphenylpolysiloxane capped at both molecular terminals with dimethylvinylsiloxy groups having a viscosity of 3,000 mPa·s, 20.6 parts by mass of an organotrisiloxane represented by the following formula:

HMe$_2$SiOPh$_2$SiOSiMe$_2$H (in an amount that the amount of silicon-bonded hydrogen atoms in this component is 1 mol per 1 mol of the total vinyl groups in the organopolysiloxane and the methylphenylpolysiloxane described above), and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. was sufficiently cured with no surface tackiness. The DSC heat generation peak temperature of this curable silicone composition was 111° C. The water vapor permeability of the cured product was 13 g/m$^2$·24 h.

Practical Example 12

A curable silicone composition with a viscosity of 5,200 mPa·s was prepared by mixing 80.7 parts by mass of the organopolysiloxane prepared in Practical Example 6, 19.3 parts by mass of an organotrisiloxane represented by the following formula:

HMe$_2$SiOPh$_2$SiOSiMe$_2$H (in an amount that the amount of silicon-bonded hydrogen atoms in this component is 1 mol per 1 mol of the total vinyl groups in the organopolysiloxane described above), and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. was sufficiently cured with no surface tackiness. The DSC heat generation peak temperature of this curable silicone composition was 114° C. The water vapor permeability of the cured product was 7.4 g/m$^2$·24 h.

Comparative Example 4

A curable silicone composition with a viscosity of 7,600 mPa·s was prepared by mixing 78.1 parts by mass of the organopolysiloxane prepared in Comparative Example 1, 21.9 parts by mass of an organotrisiloxane represented by the following formula:

HMe$_2$SiOPh$_2$SiOSiMe$_2$H (in an amount that the amount of silicon-bonded hydrogen atoms in this component is 1 mol per 1 mol of vinyl groups in the organopolysiloxane described above), 2 parts by mass of the adhesion-imparting agent prepared in Reference Example 1, and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. demonstrated surface tackiness and was not sufficiently cured. The DSC heat generation peak temperature of this curable silicone composition was 122° C. The water vapor permeability of the cured product was 6.7 g/m$^2$·24 h.

By comparing and contrasting Practical Examples 7, 8, and 12 and Comparative Example 4, it was observed that the curable silicone compositions of Practical Examples 7, 8, and 12 demonstrated better curability than the curable silicone composition of Comparative Example 4.

Comparative Example 5

A curable silicone composition with a viscosity of 5,400 mPa·s was prepared by mixing 63.9 parts by mass of the organopolysiloxane prepared in Comparative Example 1, 15.6 parts by mass of a methylphenylpolysiloxane capped at both molecular terminals with dimethylvinylsiloxy groups having a viscosity of 3,000 mPa·s, 20.5 parts by mass of an organotrisiloxane represented by the following formula:

HMe$_2$SiOPh$_2$SiOSiMe$_2$H (in an amount that the amount of silicon-bonded hydrogen atoms in this component is 1 mol per 1 mol of the total vinyl groups in the organopolysiloxane and the methylphenylpolysiloxane described above), and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. demonstrated surface tackiness and was not sufficiently cured. The DSC heat generation peak temperature of this curable silicone composition was 120° C. The water vapor permeability of the cured product was 12 g/m$^2$·24 h.

By comparing and contrasting Practical Examples 9, 10, and 11 and Comparative Example 5, it was observed that the curable silicone compositions of Practical Examples 9, 10, and 11 demonstrated better curability than the curable silicone composition of Comparative Example 5.

Comparative Example 6

A curable silicone composition with a viscosity of 4,000 mPa·s was prepared by mixing 73.5 parts by mass of the organopolysiloxane prepared in Comparative Example 2, 26.5 parts by mass of an organotrisiloxane represented by the following formula:

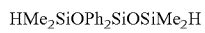
HMe$_2$SiOPh$_2$SiOSiMe$_2$H (in an amount that the amount of silicon-bonded hydrogen atoms in this component is 1 mol per 1 mol of the total vinyl groups in the organopolysiloxane described above), and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. was sufficiently cured with no surface tackiness. The DSC heat generation peak temperature of this curable silicone composition was 92.5° C. The water vapor permeability of the cured product was 11.4 g/m$^2$·24 h.

By comparing and contrasting Practical Examples 7, 8, and 12 and Comparative Example 6, it was observed that the curable silicone compositions of Practical Examples 7, 8, and 12 demonstrated better curability than the curable silicone composition of Comparative Example 6.

Comparative Example 7

A curable silicone composition with a viscosity of 3,000 mPa·s was prepared by mixing 61.8 parts by mass of the organopolysiloxane prepared in Comparative Example 2, 15.2 parts by mass of a methylphenylpolysiloxane capped at both molecular terminals with dimethylvinylsiloxy groups having a viscosity of 3,000 mPa·s, 23.0 parts by mass of an organotrisiloxane represented by the following formula:

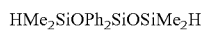
HMe$_2$SiOPh$_2$SiOSiMe$_2$H (in an amount that the amount of silicon-bonded hydrogen atoms in this component is 1 mol per 1 mol of the total vinyl groups in the organopolysiloxane and the methylphenylpolysiloxane described above), and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. was sufficiently cured with no surface tackiness. The DSC heat generation peak temperature of this curable silicone composition was 93° C. The water vapor permeability of the cured product was 15 g/m$^2$·24 h.

By comparing and contrasting Practical Examples 9, 10, and 11 and Comparative Example 7, it was observed that the curable silicone compositions of Practical Examples 9, 10, and 11 demonstrated better curability than the curable silicone composition of Comparative Example 7.

Practical Example 13

A curable silicone composition with a viscosity of 4,500 mPa·s was prepared by mixing 60.6 parts by mass of the organopolysiloxane prepared in Practical Example 4, 14.0 parts by mass of a methylphenylpolysiloxane capped at both molecular terminals with dimethylvinylsiloxy groups having a viscosity of 3,000 mPa·s, 25.4 parts by mass of an organotrisiloxane represented by the following formula:

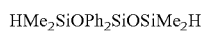
HMe$_2$SiOPh$_2$SiOSiMe$_2$H (in an amount that the amount of silicon-bonded hydrogen atoms in this component is 1 mol per 1 mol of the total vinyl groups in the organopolysiloxane and the methylphenylpolysiloxane described above), and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. was sufficiently cured with no surface tackiness. The DSC heat generation peak temperature of this curable silicone composition was 131.2° C. The water vapor permeability of the cured product was 3.4 g/m$^2$·24 h.

Practical Example 14

A curable silicone composition with a viscosity of 4,100 mPa·s was prepared by mixing 59.8 parts by mass of the organopolysiloxane prepared in Practical Example 5, 14.0 parts by mass of a methylphenylpolysiloxane capped at both molecular terminals with dimethylvinylsiloxy groups having a viscosity of 3,000 mPa·s, 26.2 parts by mass of an organotrisiloxane represented by the following formula:

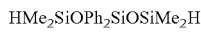
HMe$_2$SiOPh$_2$SiOSiMe$_2$H (in an amount that the amount of silicon-bonded hydrogen atoms in this component is 1 mol per 1 mol of the total vinyl groups in the organopolysiloxane and the methylphenylpolysiloxane described above), and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. was sufficiently cured with no surface tackiness. The DSC heat generation peak temperature of this curable silicone composition was 128.5° C. The water vapor permeability of the cured product was 3.6 g/m$^2$·24 h.

Comparative Example 8

A curable silicone composition with a viscosity of 3,600 mPa·s was prepared by mixing 60.7 parts by mass of the organopolysiloxane prepared in Comparative Example 3, 14.0 parts by mass of a methylphenylpolysiloxane capped at both molecular terminals with dimethylvinylsiloxy groups having a viscosity of 3,000 mPa·s, 25.3 parts by mass of an organotrisiloxane represented by the following formula:

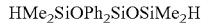
HMe$_2$SiOPh$_2$SiOSiMe$_2$H (in an amount that the amount of silicon-bonded hydrogen atoms in this component is 1 mol per 1 mol of the total vinyl groups in the organopolysiloxane and the methylphenylpolysiloxane described above), and 0.2 parts by mass of a 1,3,5,7-tetramethyl-1,3,5,7-tetravinylcyclotetrasiloxane solution of a platinum-1,3-divinyl-1,1,3,3-tetramethyldisiloxane complex (containing 0.1 mass % of platinum).

A cured product obtained by heating this curable silicone composition for 2 minutes at 150° C. demonstrated surface tackiness and was not sufficiently cured. The DSC heat generation peak temperature of this curable silicone composition was 133.7° C. The water vapor permeability of the cured product was 3.7 g/m$^2$24 h.

By comparing and contrasting Practical Examples 13 and 14 and Comparative Example 8, it was observed that the curable silicone compositions of Practical Examples 13 and 14 formed cured products having approximately the same water vapor permeability as that of Comparative Example 8 and demonstrated better curability than the curable silicone composition of Comparative Example 8.

Practical Example 15

An optical semiconductor device was produced by using the curable silicone composition prepared in Practical Example 8. When the reliability of this optical semiconductor device was evaluated, no changes in luminous efficiency were observed before and after exposure tests.

Comparative Example 9

An optical semiconductor device was produced by using the curable silicone composition prepared in Comparative Example 6. When the reliability of this optical semiconductor device was evaluated, the luminous efficiency decreased by approximately 6% after exposure tests in comparison to the luminous efficiency prior to exposure tests.

INDUSTRIAL APPLICABILITY

The curable silicone composition of the present invention can be used as an adhesive, a potting agent, a protective agent, a coating agent, or an underfill agent for electrical/electronic use. In particular, the curable silicone composition has high reactivity and can form a cured product with low gas permeability, so the composition is suitable as a sealing agent or a protective coating material for an optical semiconductor element in an optical semiconductor device such as a light emitting diode (LED).

DESCRIPTION OF SYMBOLS

1 Optical semiconductor element
2 Lead frame
3 Lead frame
4 Bonding wire
5 Frame material
6 Cured product of the curable silicone composition

The invention claimed is:

1. A curable silicone composition comprising:
   (A) an organopolysiloxane represented by the following average unit formula:

$(PhSiO_{3/2})_a(MeViPhSiO_{1/2})_b(Me_2ViSiO_{1/2})_d$, wherein, "a", "b", and "d" are respectively numbers satisfying $0.01 \leq a \leq 0.45$, $0.01 \leq b \leq 0.45$, $0.1 \leq d < 0.9$, and $a+b+d=1$;
   (B) a straight-chain organopolysiloxane having at least two alkenyl groups and not having any silicon-bonded hydrogen atoms in a molecule, in 0 to 70 mass % of this composition;
   (C) an organotrisiloxane represented by the following formula:

$HMe_2SiOPh_2SiOSiMe_2H$, in an amount that the amount of silicon-bonded hydrogen atoms in this component is from 0.1 to 5 mol per 1 mol of total alkenyl groups in components (A) and (B); and
   (D) an effective amount of a hydrosilylation reaction catalyst.

2. The curable silicone composition according to claim 1, wherein component (B) is selected from copolymers of dimethylsiloxane and methylvinylsiloxane capped at both molecular terminals with trimethylsiloxy groups, methylvinylpolysiloxanes capped at both molecular terminals with trimethylsiloxy groups, copolymers of dimethylsiloxane, methylvinylsiloxane, and methylphenylsiloxane capped at both molecular terminals with trimethylsiloxy groups, dimethylpolysiloxanes capped at both molecular terminals with dimethylvinylsiloxy groups, methylvinylpolysiloxanes capped at both molecular terminals with dimethylvinylsiloxy groups, copolymers of dimethylsiloxane and methylvinylsiloxane capped at both molecular terminals with dimethylvinylsiloxy groups, copolymers of dimethylsiloxane, methylvinylsiloxane, and methylphenylsiloxane capped at both molecular terminals with dimethylvinylsiloxy groups, and combinations thereof.

3. The curable silicone composition according to claim 2, wherein component (B) is in the composition in a range of 0 to 40 mass % with respect to the composition.

* * * * *